(12) United States Patent
Kim et al.

(10) Patent No.: US 7,723,143 B2
(45) Date of Patent: May 25, 2010

(54) METHOD FOR MANUFACTURING CANTILEVER STRUCTURE OF PROBE CARD

(75) Inventors: Bong Hwan Kim, Seoul (KR); Jong Bok Kim, Goyang-si (KR)

(73) Assignee: Will Technology Co., Ltd., Suwon-si (KR)

( * ) Notice: Subject to any disclaimer, the term of this patent is extended or adjusted under 35 U.S.C. 154(b) by 558 days.

(21) Appl. No.: 11/760,022

(22) Filed: Jun. 8, 2007

(65) Prior Publication Data
US 2008/0190885 A1      Aug. 14, 2008

(30) Foreign Application Priority Data
Feb. 12, 2007   (KR) ...................... 10-2007-0014478

(51) Int. Cl.
*H01L 21/00*   (2006.01)

(52) U.S. Cl. .............................. 438/50; 438/51; 438/52; 438/53; 216/2; 216/47

(58) Field of Classification Search ....................... None
See application file for complete search history.

(56) References Cited

U.S. PATENT DOCUMENTS

| | | | |
|---|---|---|---|
| 5,595,942 A * | 1/1997 | Albrecht et al. | 438/52 |
| 6,607,934 B2 * | 8/2003 | Chang et al. | 438/50 |
| 2005/0189958 A1 * | 9/2005 | Chen et al. | 324/762 |
| 2005/0210967 A1 * | 9/2005 | Minne | 73/105 |

* cited by examiner

*Primary Examiner*—Duy-Vu N Deo
(74) *Attorney, Agent, or Firm*—Sughrue Mion, PLLC

(57) ABSTRACT

A method for manufacturing a cantilever structure of a probe card is disclosed. In accordance with the method of the present invention, a first sacrificial wafer is used as a mold to form a cantilever structure having various shapes, a microscopic pitch and a high aspect ratio. In accordance with the method of the present invention, a probe tip may be formed by using a second sacrificial substrate and a bonding.

10 Claims, 9 Drawing Sheets

METHOD FOR MANUFACTURING CANTILEVER STRUCTURE OF PROBE CARD

BACKGROUND OF THE INVENTION

1. Field of the Invention

The present invention relates to a method for manufacturing a cantilever structure of a probe card, and more particularly to a method for manufacturing a cantilever structure of a probe card wherein a silicon wafer is used as a mold to form a cantilever structure having various shapes, a microscopic pitch and a high aspect ratio.

2. Description of the Related Art

Generally, one or more dies are formed on a wafer. A wafer-level test should be carried out to find out that the one or more dies are not defective. The wafer-level test is carried out using a probe card having a plurality of cantilever structure having a probe beam, a tip and a bump. The cantilever structures contact a plurality of pads formed on the wafer, and relays a test signal from a tester to the plurality of pads to carry out the test.

As a size of a semiconductor device is reduced, a pitch of the pads is also reduced. Therefore, a distance between the probe tips for carrying out the test by contacting the pads is also drastically reduced. In addition, a number of the probe tips are drastically increased in order to test a large number of dies per test.

Therefore, a need for a probe card including a cantilever structure having various pitched and shapes is increasing.

SUMMARY OF THE INVENTION

It is an object of the present invention to provide a method for manufacturing a cantilever structure of a probe card wherein a silicon wafer is used as a mold to form a cantilever structure having various shapes, a microscopic pitch and a high aspect ratio.

In accordance with the present invention, there is provided a method for manufacturing a cantilever structure, comprising steps of: (a) forming a first mask layer pattern defining a probe beam region and a second mask layer pattern defining a bump on first and second surfaces of a first sacrificial substrate, respectively; (b) etching the first sacrificial substrate exposed by the first mask layer pattern and the second mask layer pattern to form the probe beam region and the bump region mutually connected; (c) removing the first mask layer pattern and the second mask layer pattern; (d) bonding the first sacrificial substrate including the probe beam region and the bump region to an insulating substrate; (e) forming a cantilever structure filling the probe beam region and the bump region; and (f) removing the first sacrificial substrate.

The method in accordance with the present invention may further comprise forming an oxide film on a surface of the first sacrificial substrate after carrying out the step (c).

The method in accordance with the present invention may further comprise forming a first bonding layer between the first sacrificial substrate and the insulating substrate.

The method in accordance with the present invention may further comprise forming a probe tip at an end portion of the cantilever structure.

Preferably, the probe tip formation step comprises: forming a third mask layer pattern exposing a probe tip region of the cantilever structure is formed; forming the probe tip in the probe tip region; and removing the third mask layer pattern.

Preferably, the probe tip formation step comprises: forming a fourth mask layer pattern exposing a portion of a second sacrificial substrate corresponding to a probe tip region of the cantilever structure is formed on the second sacrificial substrate; etching the second sacrificial substrate using the fourth mask layer pattern as a mask to form the probe tip region; forming the probe tip in the probe tip region; forming a fifth mask layer pattern exposing the probe tip and an adjacent region; forming a second bonding layer in a region exposed by the fifth mask layer pattern; removing the fifth mask layer pattern; bonding the second bonding layer to the probe tip region of the cantilever structure; and removing the second sacrificial substrate.

It is preferable that each of the first mask layer pattern and the second mask layer pattern comprises a TEOS film.

It is also preferable that the first bonding layer comprises a photoresist film.

Preferably, the insulating substrate comprises one of a ceramic substrate, a glass substrate, an insulating silicon substrate and combinations thereof.

Preferably, the step (e) comprises an electroplating process.

BRIEF DESCRIPTION OF THE DRAWINGS

FIGS. 2a through 2l are plane and cross-sectional views illustrating a method for manufacturing a cantilever structure of a probe card in accordance with a second embodiment of the present invention.

DETAILED DESCRIPTION OF THE INVENTION

The present invention will now be described in detail with reference to the accompanied drawings. The interpretations of the terms and wordings used in Description and Claims should not be limited to common or literal meanings. The embodiments of the present invention are provided to describe the present invention more thoroughly for those skilled in the art.

FIGS. 1a through 1i are cross-sectional views illustrating a method for manufacturing a cantilever structure of a probe card in accordance with a first embodiment of the present invention.

Figure 1A:
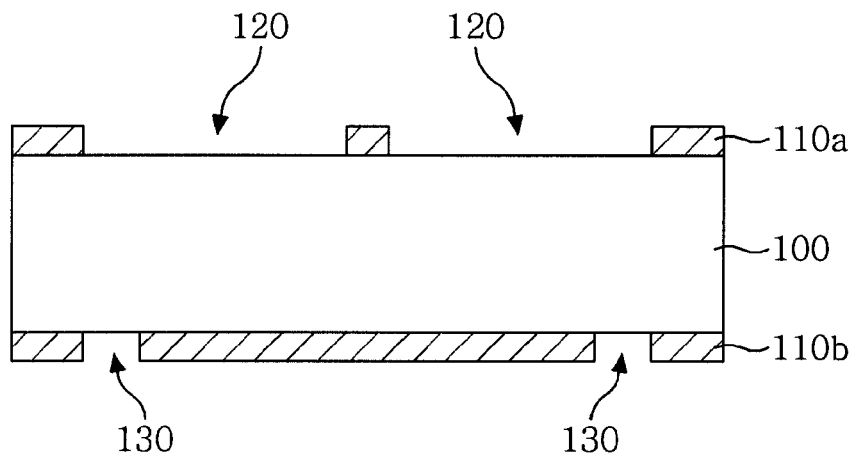
FIGS. 1a through 1i are cross-sectional views illustrating a method for manufacturing a cantilever structure of a probe card in accordance with a first embodiment of the present invention.

Referring to FIG. 1a, first and second mask layers (not shown) are formed on first and second surface of a first sacrificial substrate 100, respectively. It is preferable that the first and second mask layers comprise a photoresist film or a TEOS film.

Thereafter, a first mask layer pattern 100a defining a probe beam region 120 and a second mask layer pattern 100b defining a bump are formed on the first surface and the second surface of the first sacrificial substrate 100, respectively via a photolithography and etching process.

Figure 1B:
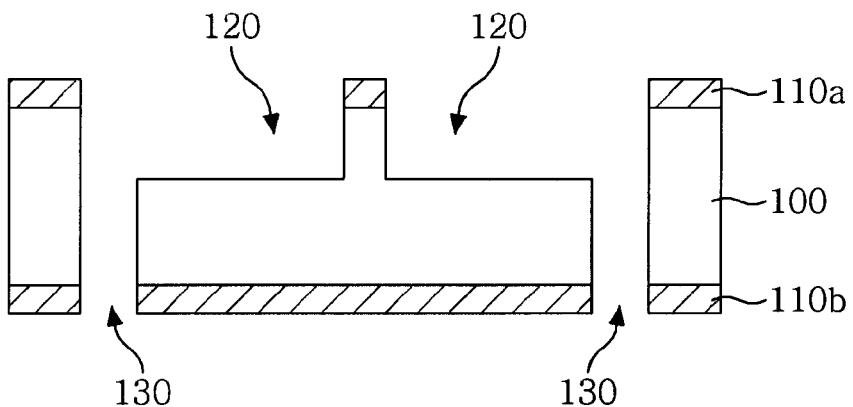

Referring to FIG. 1b, the first sacrificial substrate 100 exposed by the first mask layer pattern 100a and the second mask layer pattern 100b are etched to form the probe beam region 120 and the bump region 130. As shown in FIG. 1b, the first surface and the second surface of the first sacrificial substrate 100 is subjected to a deep etching so that the probe beam region 120 and the bump region 130 formed on opposite sides are mutually connected.

Thereafter, the first mask layer pattern 100a and the second mask layer pattern 100b are removed to expose the surfaces of the first sacrificial substrate 100.

Figure 1C:
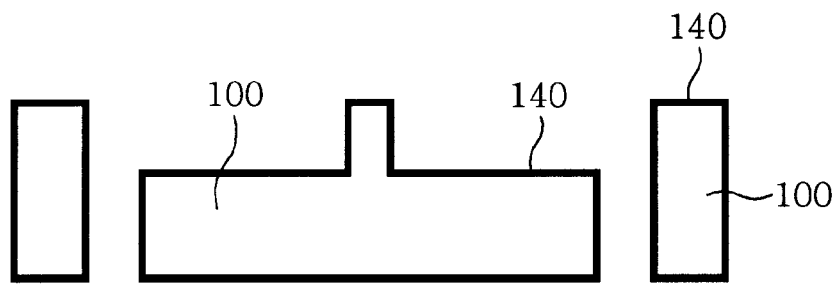

Referring to FIG. 1c, the surfaces of the first sacrificial substrate 100 is oxidized to form an oxide film 140.

Figure 1D:
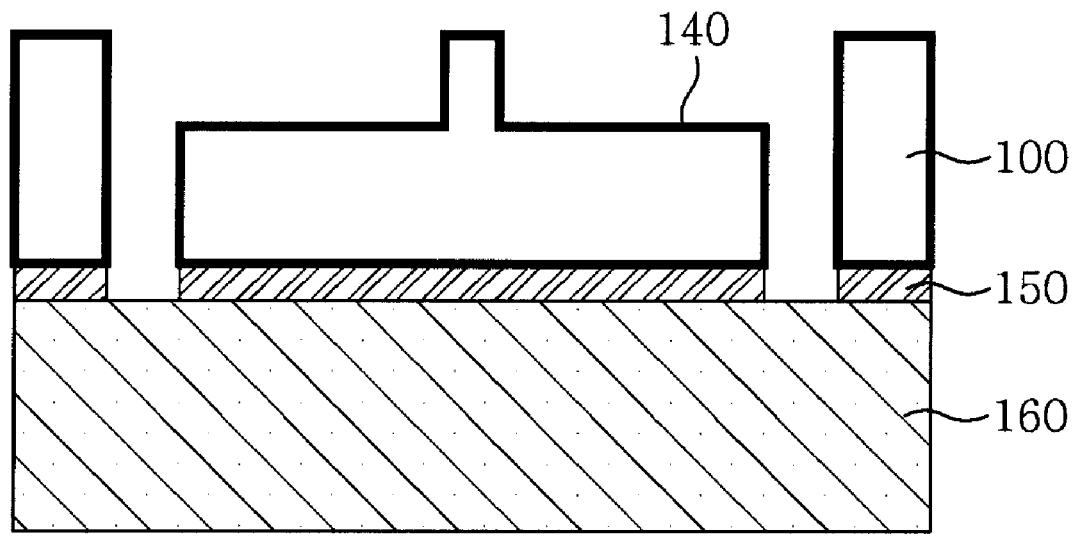

Referring to FIG. 1d, a first bonding layer 150 is formed on the second surface of the first sacrificial substrate 100. The first bonding layer 150 facilitates a bonding of the first sacrificial substrate 100 and an insulating substrate 160. It is preferable that the first bonding layer 150 comprises a photoresist film.

Thereafter, the first sacrificial substrate 100 including the probe beam region 120 and the bump region 130 is bonded to the insulating substrate 160. It preferable that the insulating substrate 160 comprises one of a ceramic substrate, a glass substrate, an insulating silicon substrate and combinations thereof.

Figure 1E:
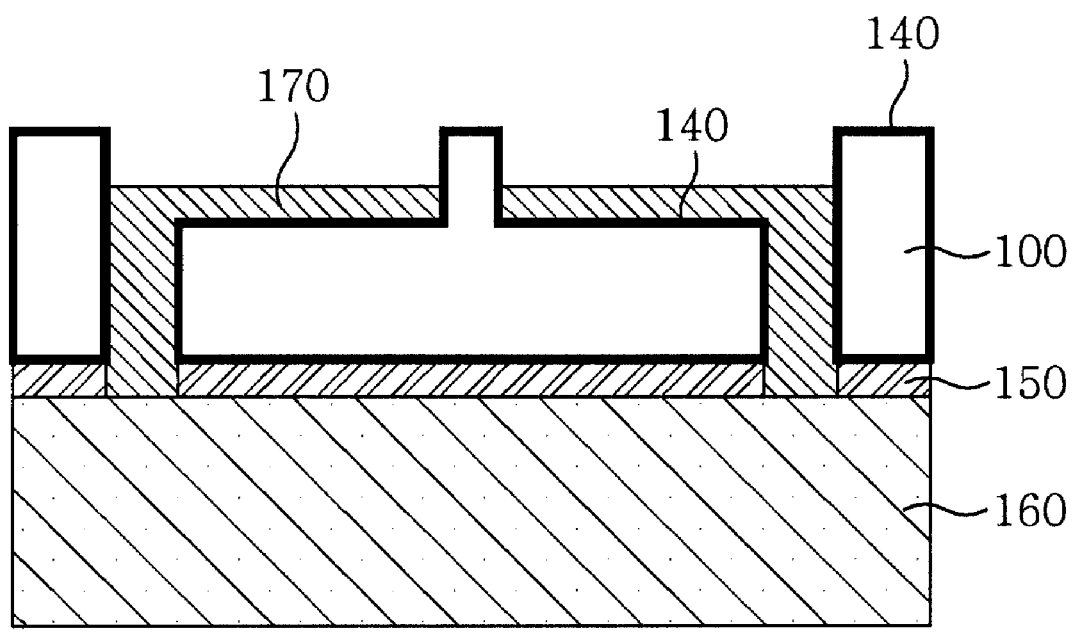
Figure 1F:
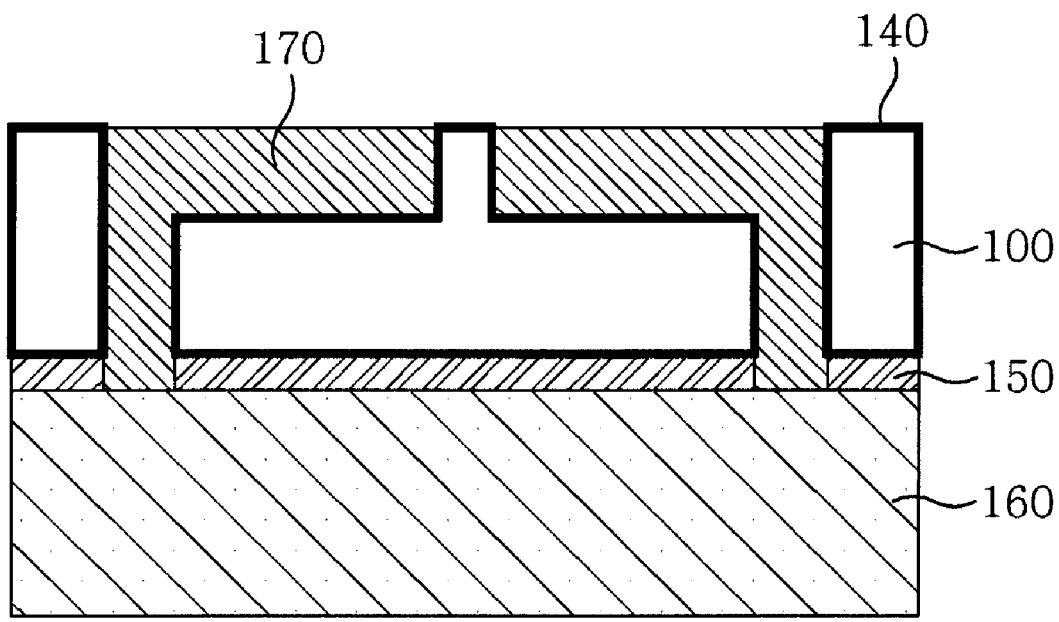

Referring to FIGS. 1e and 1f, a cantilever structure 170 filling the probe beam region 120 and the bump region 130 is formed. It is preferable that the cantilever structure 170 is formed via electroplating process.

Figure 1G:
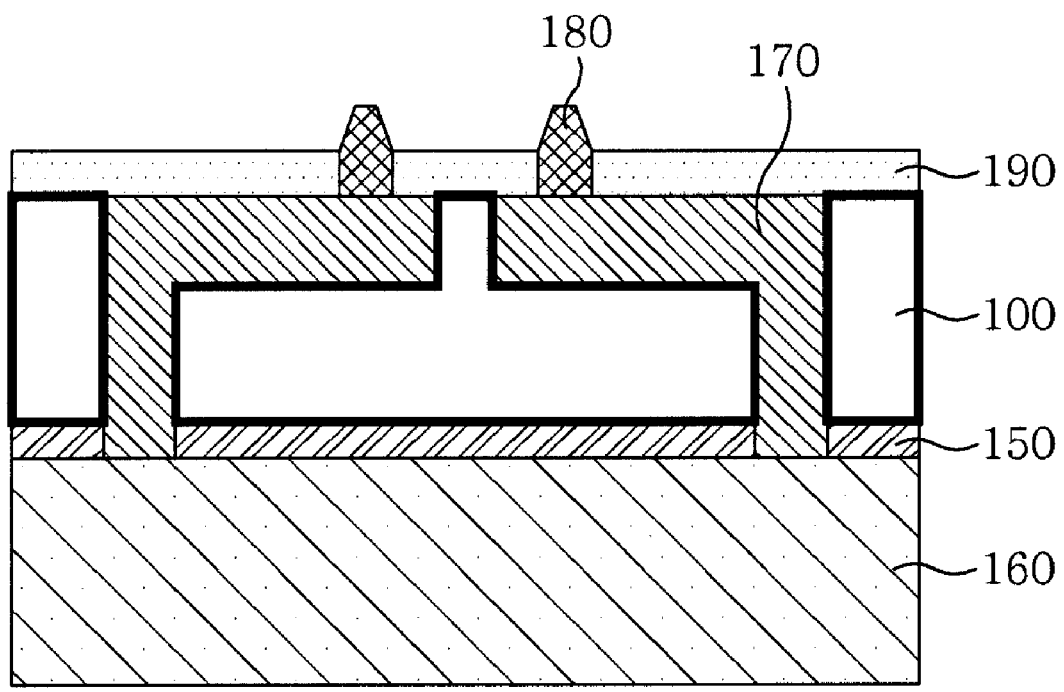

Referring to FIG. 1g, a third mask layer (not shown) is formed on an exposed portion of the cantilever structure 170 and the first sacrificial substrate 100. Thereafter, the third mask layer is selectively etched to form a third mask layer pattern 180 exposing a probe tip region of the cantilever structure 170 disposed at an end portion of the cantilever structure 170. The probe tip 190 is then formed in the probe tip region.

Figure 1H:
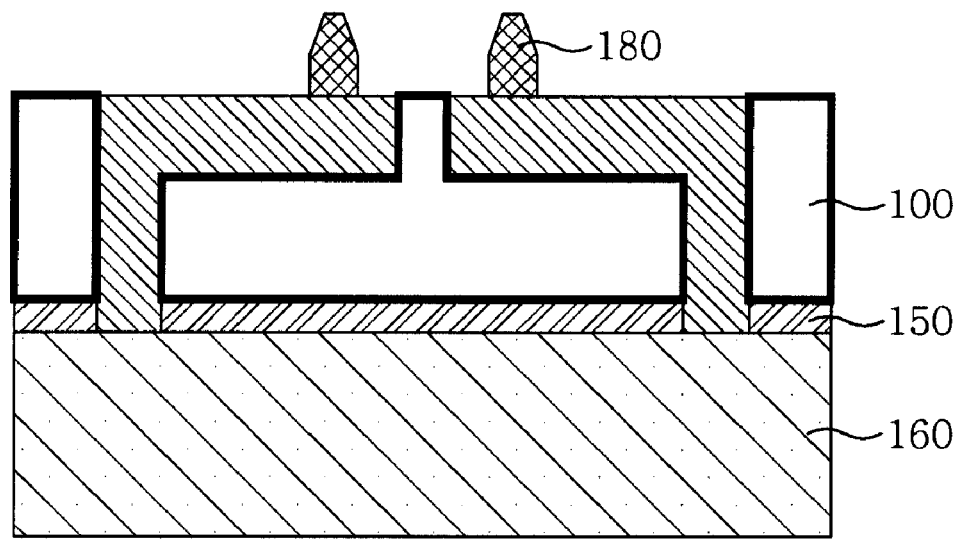

Referring to FIG. 1h, the third mask layer pattern 180 is removed.

Figure 1I:
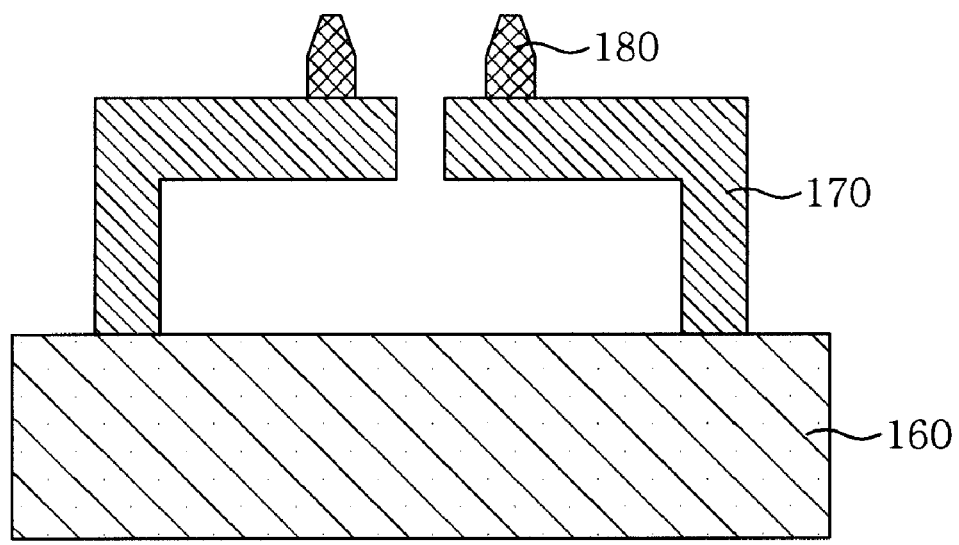

Referring to FIG. 1i, the first sacrificial substrate 100 is removed to complete the formation of the cantilever structure 170.

FIGS. 2a through 2e are plane and cross-sectional views illustrating a method for manufacturing a cantilever structure of a probe card in accordance with a second embodiment of the present invention.

Figure 2A:
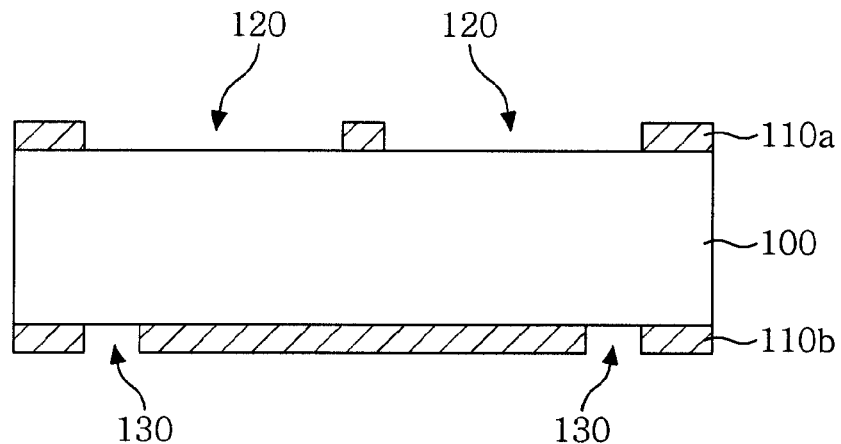

Referring to FIG. 2a, first and second mask layers (not shown) are formed on first and second surface of a first sacrificial substrate 100, respectively. It is preferable that the first and second mask layers comprise a photoresist film or a TEOS film.

Thereafter, a first mask layer pattern 100a defining a probe beam region 120 and a second mask layer pattern 100b defining a bump are formed on the first surface and the second surface of the first sacrificial substrate 100, respectively via a photolithography and etching process.

Figure 2B:
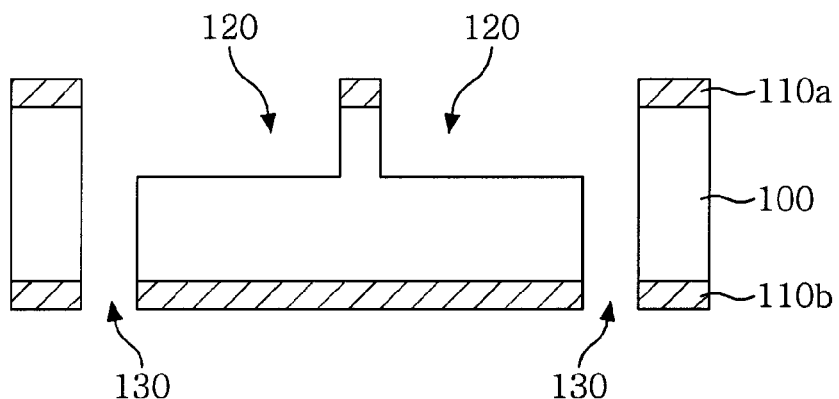

Referring to FIG. 2b, the first sacrificial substrate 100 exposed by the first mask layer pattern 100a and the second mask layer pattern 100b are etched to form the probe beam region 120 and the bump region 130. As shown in FIG. 1b, the first surface and the second surface of the first sacrificial substrate 100 is subjected to a deep etching so that the probe beam region 120 and the bump region 130 formed on opposite sides are mutually connected.

Thereafter, the first mask layer pattern 100a and the second mask layer pattern 100b are removed to expose the surfaces of the first sacrificial substrate 100.

Figure 2C:
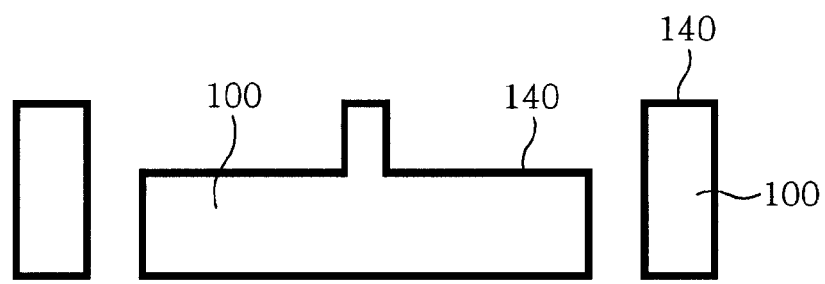

Referring to FIG. 2c, the surfaces of the first sacrificial substrate 100 is oxidized to form an oxide film 140.

Figure 2D:
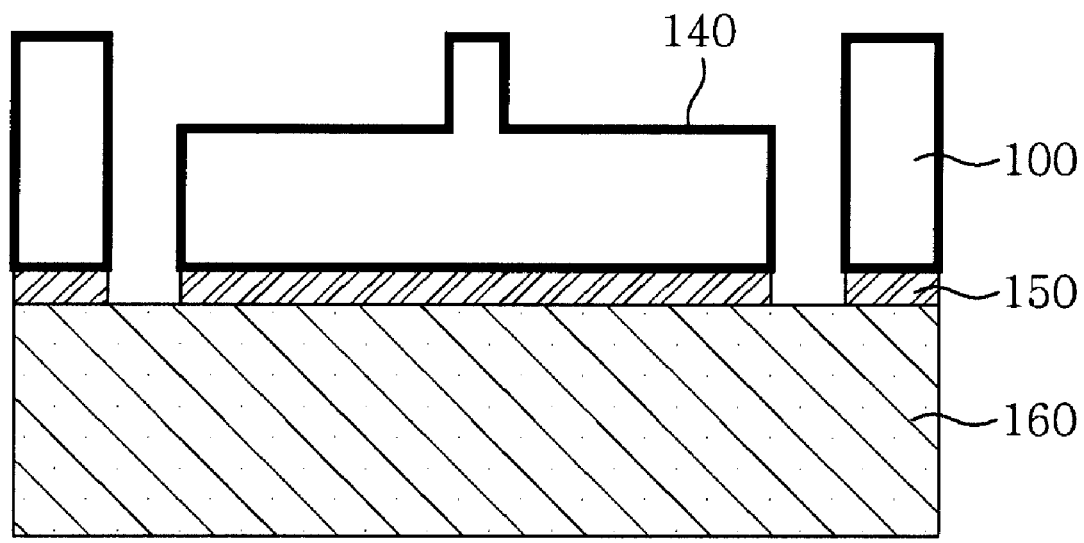

Referring to FIG. 2d, a first bonding layer 150 is formed on the second surface of the first sacrificial substrate 100. The first bonding layer 150 facilitates a bonding of the first sacrificial substrate 100 and an insulating substrate 160. It is preferable that the first bonding layer 150 comprises a photoresist film.

Thereafter, the first sacrificial substrate 100 including the probe beam region 120 and the bump region 130 is bonded to the insulating substrate 160. It preferable that the insulating substrate 160 comprises one of a ceramic substrate, a glass substrate, an insulating silicon substrate and combinations thereof.

Figure 2E:
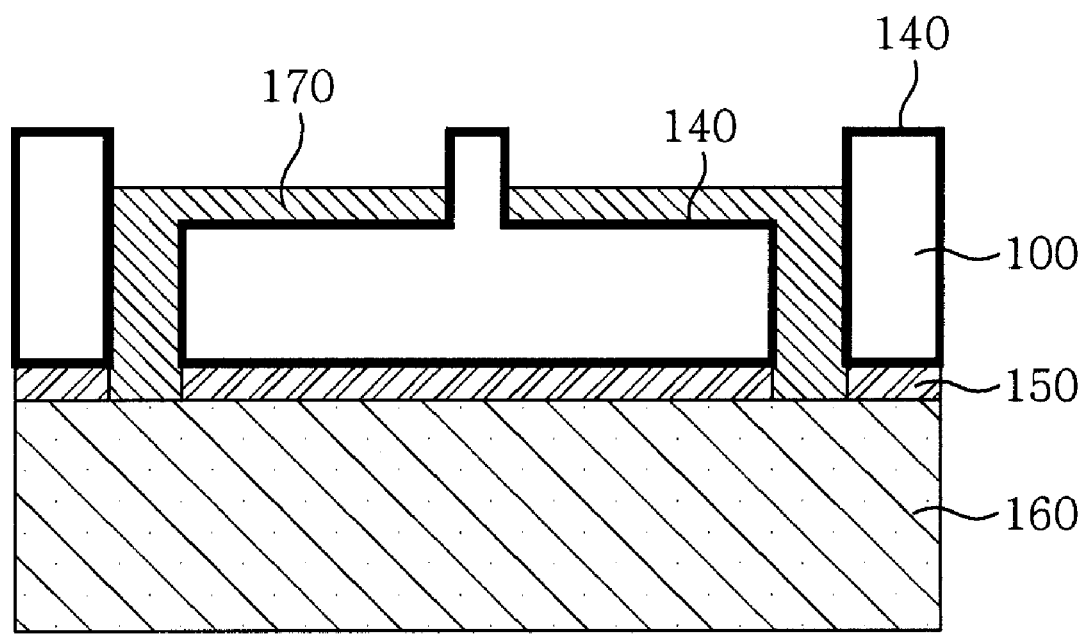
Figure 2F:
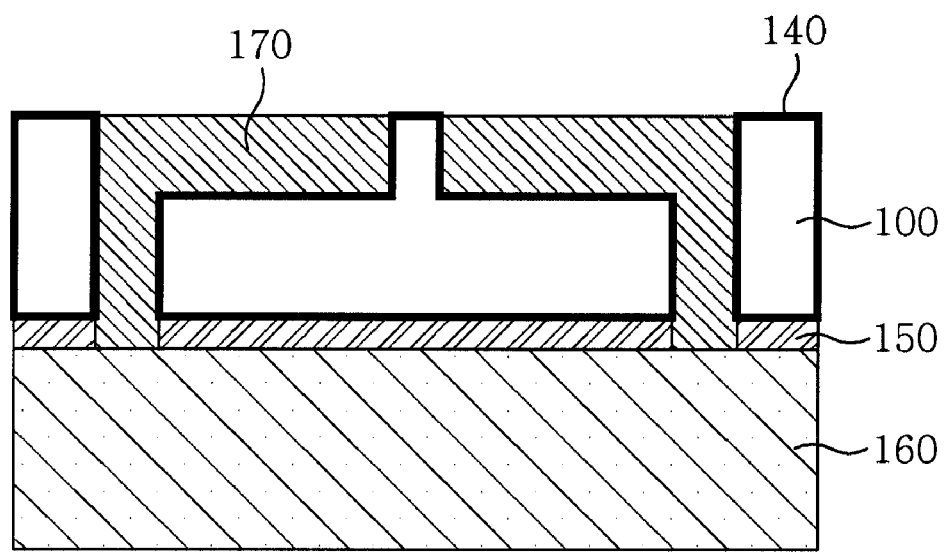

Referring to FIGS. 2e and 2f, a cantilever structure 170 filling the probe beam region 120 and the bump region 130 is formed. It is preferable that the cantilever structure 170 is formed via electroplating process.

Figure 2G:
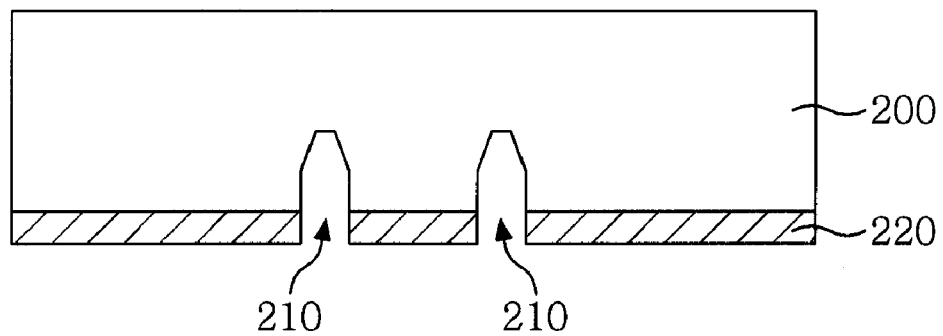

Referring to FIG. 2g, a fourth mask layer (not shown) is formed on a second sacrificial substrate 200. Thereafter, the fourth mask layer is selectively etched to form a fourth mask layer pattern 220 exposing a portion of the second sacrificial substrate 200 corresponding to a probe tip region 210 of the cantilever structure 170 disposed at an end portion of the cantilever structure 170. Thereafter, the second sacrificial substrate 200 is etched using the fourth mask layer pattern 220 as a mask to form the probe tip region 210. The fourth mask layer pattern 220 is then removed.

Figure 2H:
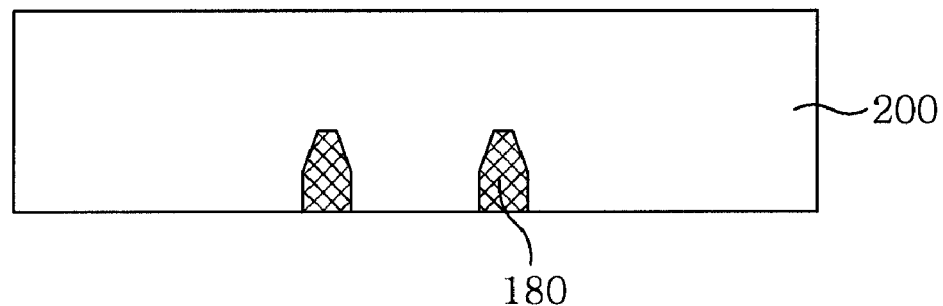

Referring to FIG. 2h, a probe tip 180 filling the probe tip region 210 is formed.

Figure 2I:
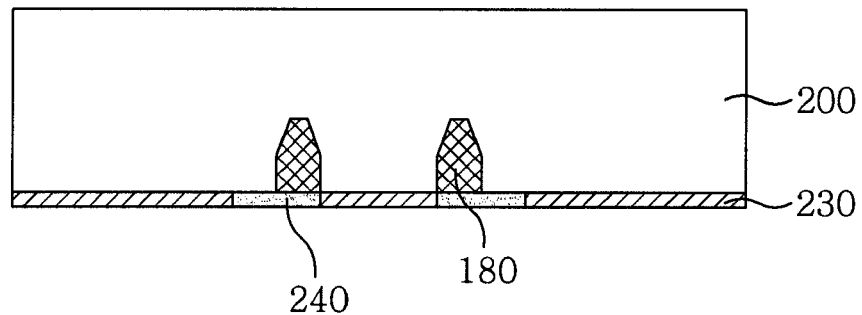

Referring to FIG. 2i, a fifth mask layer (not shown) is formed on the second sacrificial substrate 200. Thereafter, the fifth mask layer is selectively etched to form a fifth mask layer pattern 230 exposing the probe tip 180 and an adjacent region. Thereafter, a second bonding layer 240 is formed in a region exposed by the fifth mask layer pattern 230.

Figure 2J:
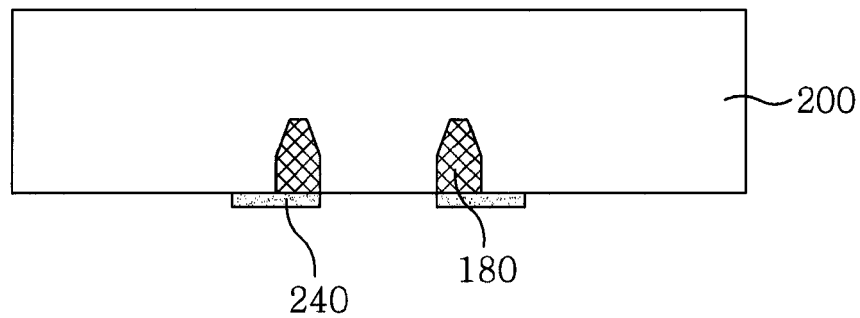

Referring to FIG. 2j, the fifth mask layer pattern 230 is removed.

Figure 2K:
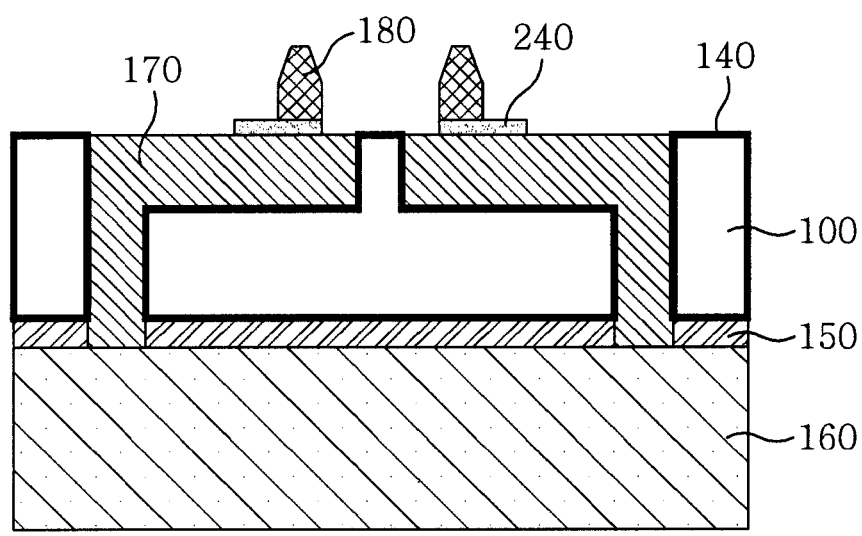
Figure 21:
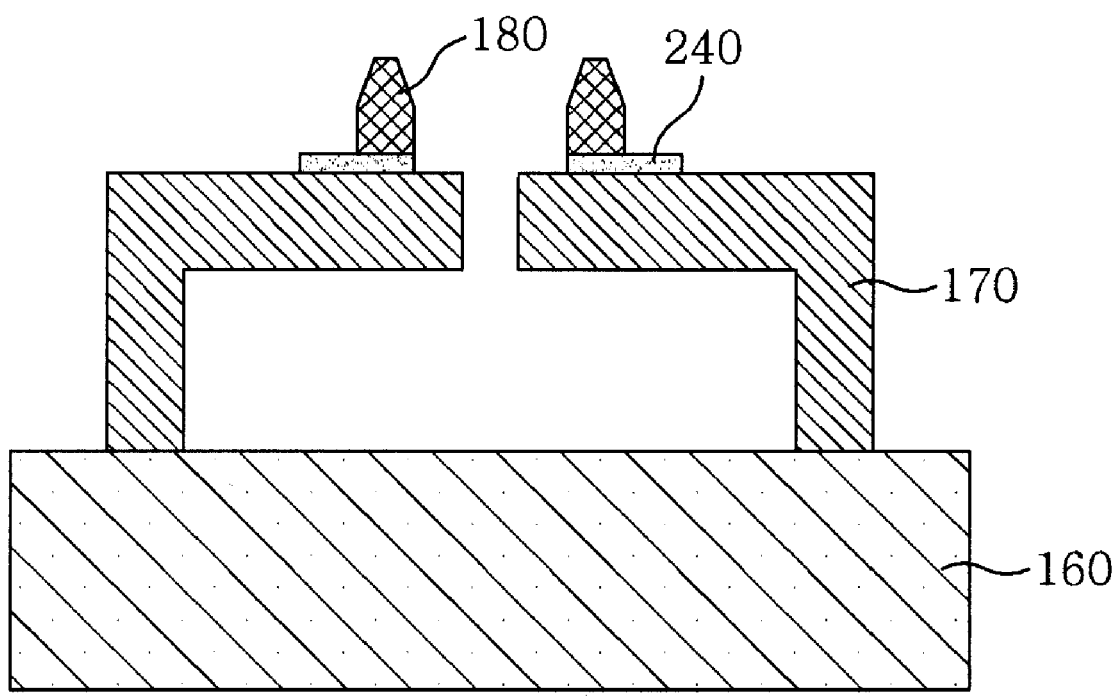

Referring to FIG. 2k, the second bonding layer 240 is bonded to the probe tip region of the cantilever structure 170. The second sacrificial substrate 200 is then removed to complete the formation of the cantilever structure 170.

As described above,

What is claimed is:

1. A method for manufacturing a cantilever structure, comprising steps of:
    (a) forming a first mask layer pattern defining a probe beam region and a second mask layer pattern defining a bump on first and second surfaces of a first sacrificial substrate, respectively;
    (b) etching the first sacrificial substrate exposed by the first mask layer pattern and the second mask layer pattern to form the probe beam region and the bump region mutually connected;
    (c) removing the first mask layer pattern and the second mask layer pattern;
    (d) bonding the first sacrificial substrate including the probe beam region and the bump region to an insulating substrate;
    (e) forming a cantilever structure filling the probe beam region and the bump region; and
    (f) removing the first sacrificial substrate.

2. The method in accordance with claim 1, further comprising forming an oxide film on a surface of the first sacrificial substrate after carrying out the step (c).

3. The method in accordance with claim 1, further comprising forming a first bonding layer between the first sacrificial substrate and the insulating substrate.

4. The method in accordance with claim 1, further comprising forming a probe tip at an end portion of the cantilever structure.

5. The method in accordance with claim 4, wherein the probe tip formation step comprises:
    forming a third mask layer pattern exposing a probe tip region of the cantilever structure is formed;
    forming the probe tip in the probe tip region; and
    removing the third mask layer pattern.

6. The method in accordance with claim 4, wherein the probe tip formation step comprises:

forming a fourth mask layer pattern exposing a portion of a second sacrificial substrate corresponding to a probe tip region of the cantilever structure is formed on the second sacrificial substrate;

etching the second sacrificial substrate using the fourth mask layer pattern as a mask to form the probe tip region;

forming the probe tip in the probe tip region;

forming a fifth mask layer pattern exposing the probe tip and an adjacent region;

forming a second bonding layer in a region exposed by the fifth mask layer pattern;

removing the fifth mask layer pattern;

bonding the second bonding layer to the probe tip region of the cantilever structure; and removing the second sacrificial substrate.

7. The method in accordance with claim 1, wherein each of the first mask layer pattern and the second mask layer pattern comprises a TEOS film.

8. The method in accordance with claim 1, wherein the first bonding layer comprises a photoresist film.

9. The method in accordance with claim 1, wherein the insulating substrate comprises one of a ceramic substrate, a glass substrate, an insulating silicon substrate and combinations thereof.

10. The method in accordance with claim 1, wherein the step (e) comprises an electroplating process.

* * * * *